US007391002B2

(12) United States Patent
Sato et al.

(10) Patent No.: US 7,391,002 B2
(45) Date of Patent: Jun. 24, 2008

(54) SOLID STATE IMAGING DEVICE HAVING ELECTROMAGNETIC WAVE ABSORBER ATTACHED TO A MOUNTING BOARD

(75) Inventors: Tsuneo Sato, Saitama (JP); Atsuhiko Ishihara, Saitama (JP); Akihiro Uchida, Saitama (JP); Koji Kaseda, Saitama (JP); Masahiro Kato, Saitama (JP); Shigeru Kondo, Saitama (JP)

(73) Assignee: Fujifilm Corporation, Tokyo (JP)

( * ) Notice: Subject to any disclaimer, the term of this patent is extended or adjusted under 35 U.S.C. 154(b) by 59 days.

(21) Appl. No.: 11/090,794

(22) Filed: Mar. 25, 2005

(65) Prior Publication Data

US 2005/0211888 A1 Sep. 29, 2005

(30) Foreign Application Priority Data

Mar. 26, 2004 (JP) ............................ 2004-093630

(51) Int. Cl.
*H01L 27/00* (2006.01)

(52) U.S. Cl. .................................... 250/208.1; 250/239

(58) Field of Classification Search ................ 257/222, 257/257–258, 288, 290–291, 431, 432–436, 257/440, 444; 250/214.1, 239, 208.1; 438/57, 438/73, 90, 64–66
See application file for complete search history.

(56) References Cited

U.S. PATENT DOCUMENTS

| | | | | |
|---|---|---|---|---|
| 5,550,380 | A * | 8/1996 | Sugawara et al. | 250/370.11 |
| 5,962,854 | A * | 10/1999 | Endo | 250/349 |
| 6,428,650 | B1 * | 8/2002 | Chung | 156/250 |
| 6,949,808 | B2 * | 9/2005 | Harazono | 257/433 |
| 7,038,288 | B2 * | 5/2006 | Lai et al. | 257/448 |
| 2006/0145084 | A1 * | 7/2006 | Mori et al. | 250/370.11 |

FOREIGN PATENT DOCUMENTS

| | | |
|---|---|---|
| JP | 8-236739 | 9/1996 |
| JP | 2003-224218 | 8/2003 |

* cited by examiner

*Primary Examiner*—Que T. Le
(74) *Attorney, Agent, or Firm*—McGinn IP Law Group, PLLC

(57) ABSTRACT

A solid state imaging device is constituted of an image sensor chip, a circuit board, and an electromagnetic-wave absorber formed of copper. The image sensor chip is constituted of a bare chip, a spacer, and a cover glass. First contact terminals are formed on the bare chip, and second contact terminals and GND wires are formed on the circuit board. When manufacturing, the image sensor chip is mounted at a predetermined position on the circuit board, and the first contact terminals and the second contact terminals are connected with bonding wires. The electromagnetic-wave absorber is formed to cover the bonding wires, while its end contacts to the GND wires.

19 Claims, 7 Drawing Sheets

25 47 29 34 34a 33 27 31 32 43 36 39 38 28

SOLID STATE IMAGING DEVICE HAVING ELECTROMAGNETIC WAVE ABSORBER ATTACHED TO A MOUNTING BOARD

BACKGROUND OF THE INVENTION

1. Field of the Invention

The present invention relates to a solid state imaging device.

2. Description Related to the Prior Art

A digital camera and a digital video camera are in widespread use and they are provided with a solid state imaging device and a semiconductor memory. Further, an electronic apparatus such as a personal computer, a mobile phone, an electronic notepads or the like comes into include a solid state imaging device to provide an image-taking function.

In general, the solid state imaging device of CCD type or CMOS type is used. These types of solid state imaging devices have a packaged bare chip (image sensor chip). On one side of the bare chip, a light receiving section and a charge signal transfer section are formed. On the light receiving section, plural pixels (light receiving elements) are arranged in matrix. For packaging the bare chip, as described in Japanese Patent Laid-Open Publication No. 8-236739, the bare chip is mounted on a ceramic substrate or a BGA (Ball Grid Array) substrate, and contact terminals of the bare chip are connected to contact terminals of the substrate by wire bonding, and then a cover glass is attached on the substrate.

In general, an imaging circuit including the light receiving section and the charge signal transfer section is driven at a high clock frequency. Therefore, by electromagnetic waves (electromagnetic radiation noises) radiated from bonding wires which connect the bare chip to the package, other chips such as one for driving a sensor circuit possibly malfunction. In addition, the sensor circuit possibly malfunctions by electromagnetic radiation noises radiated from the other chips. By considering this problem, Japanese Patent Laid-Open Publication No. 2003-224218 discloses that a solid state imaging device is contained in an electromagnetic-wave absorbing package formed of an electromagnetic-wave absorbing material so as to absorb and block (be electromagnetically shielded from) the electromagnetic radiation noises radiated from inside or outside of the solid state imaging device.

By the way, recently, demand is increasing for a solid state imaging device of wafer level chip size package (hereinafter referred to as WLCSP type), which can be directly mounted on a circuit board in a digital camera and any other electronic apparatuses. The solid state imaging device of WLCSP type is obtained by fixing the image sensor and forming contact terminals during the semiconductor wafer process. Because the solid state imaging device of WLCSP type can be directly mounted on the circuit board and connected thereto by the wire bonding, the digital camera and other electronic apparatuses can be downsized. However, if the solid state imaging device of WLCSP type is contained in the electromagnetic-wave absorbing package of Japanese Patent Laid-Open Publication No. 2003-224218, the size of the solid state imaging device is enlarged. Accordingly, the merit of the solid state imaging device of WLCSP type, to allow for downsizing the digital camera and other electronic apparatuses, is lost.

SUMMARY OF THE INVENTION

An object of the present invention is to electromagnetically shield a solid state imaging device and to prevent the growth in size of the imaging device at the same time.

In order to achieve the above object and the other objects, a solid state imaging device of the present invention includes a bare chip which has plural pixels arranged on a light receiving section and at least one first contact terminal to electrically connect to the pixels, a mounting board on which the bare chip is mounted and at least one second contact terminal is formed to electrically connect to the first contact terminal, at least one bonding wire to connect the first contact terminal and the second contact terminal, and an electromagnetic-wave absorber which covers the first contact terminal, the second terminal and the bonding wire without obscuring light entering the pixels.

It is preferable that the electromagnetic-wave absorber is formed of metal and connects to a ground formed on at least either one of the bare chip and the mounting board. Also it is preferable that a transparent protection member to protect the pixels is provided at a position to face the light receiving section, and that an opening for exposing the protection member is formed in the electromagnetic-wave absorber. In addition, it is preferable that a step is formed on the protection member at a position where it contacts to said electromagnetic-wave absorber so that the opening is fitted on the step.

According to the present invention, much of electromagnetic noises radiated from the contact terminals and a bonding wire can be absorbed by the electromagnetic-wave absorber, without a conventional electromagnetic-wave absorbing package. Therefore, it is possible to prevent other chips from malfunctioning due to the electromagnetic noises, and to prevent the solid state imaging device as well from malfunctioning due to the electromagnetic noises from the other chips. In addition, because the solid state imaging device is electromagnetically shielded without enlarging its size, the digital camera or other electronic apparatuses using this solid state imaging device can be downsized.

BRIEF DESCRIPTION OF THE DRAWINGS

The above objects and advantages of the present invention will become easily understood by one of ordinary skill in the art when the following detailed description would be read in connection with the accompanying drawings.

FIG. 1 is a perspective view of a digital camera including a solid state imaging device of the present invention, wherein

FIG. 5 is a sectional view of the solid state imaging device, wherein

FIG. 6 is a sectional view of a solid state imaging device of second embodiment, wherein

FIG. 7 is a sectional view of a solid state imaging device of third embodiment, wherein

PREFERRED EMBODIMENTS OF THE INVENTION

Figure 1A:
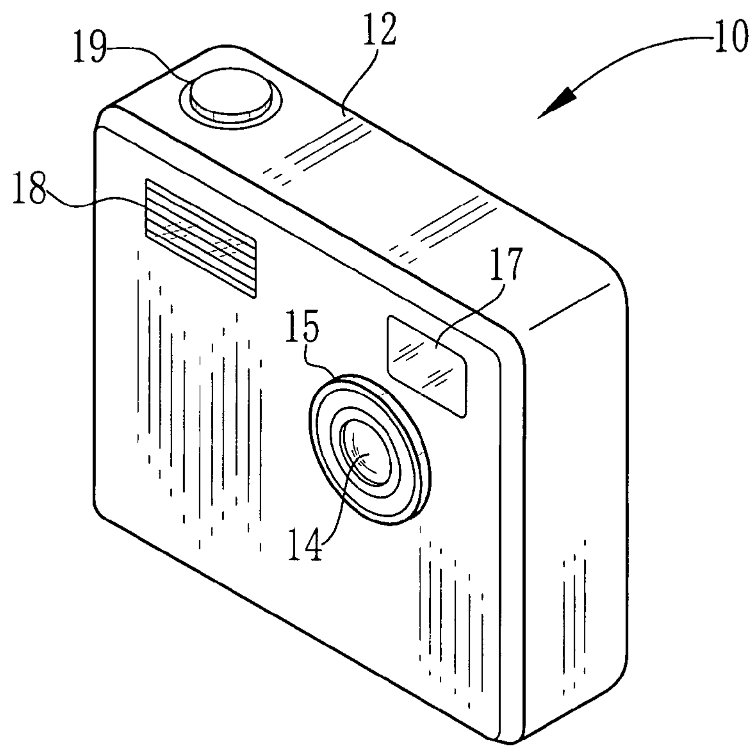
FIG. 1A shows a front side of the digital camera.
Figure 1B:
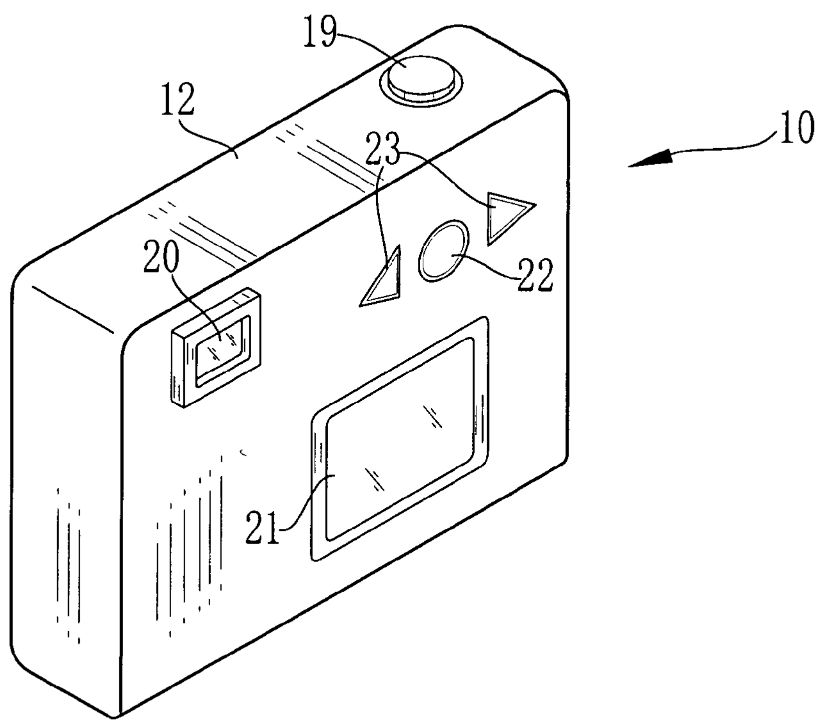
FIG. 1B shows a back side of the digital camera.

As shown in FIG. 1A and FIG. 1B, a digital camera 10 is constituted of a camera body (not shown) including photographing mechanisms and a body cover 12 which covers the camera body. On a front surface of the body cover 12, a lens barrel 15 having a taking lens 14, an object-side viewfinder window 17, a flashlight emitting unit 18 for emitting the flash light toward a subject, and so on are provided. On a top surface of the body cover 12, a release button 19 is provided.

On a rear surface of the body cover 12, an eye-side viewfinder window 20, a liquid-crystal display (LCD) 21 operable as an electric viewfinder (EVF), a mode select button 22, an operation button 23, and so on are provided. As operation modes for being selected by the mode select button, there will be a still image capturing mode for capturing still images, a moving image capturing mode for recording moving images, a play-back mode for viewing the captured still images and the recorded moving images.

Figure 2:
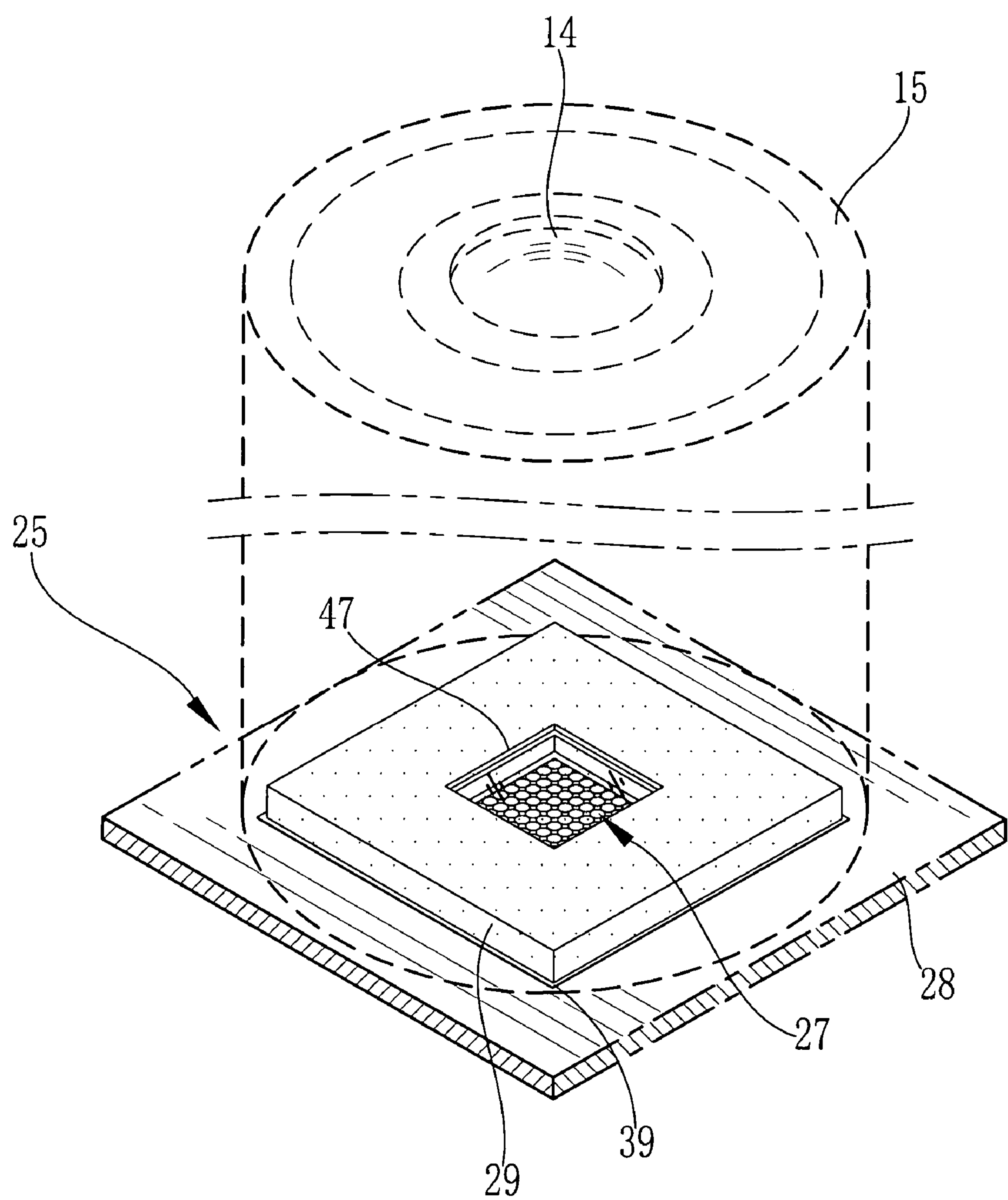
FIG. 2 is a perspective view of the solid state imaging device.

As shown in FIG. 2, a solid state imaging device 25 of WLCSP type, for capturing the subject image focused on through the taking lens 14, is provided behind the lens barrel 15. The solid state imaging device 25 is constituted of an image sensor chip 27, a circuit board 28 of the camera body on which the image sensor chip 27 is mounted, and even an electromagnetic-wave absorber 29.

Now the each component of the solid state imaging device 25 is explained with reference to FIG. 2 to FIG. 5. The image sensor chip 27 is constituted of a rectangular-shaped bare chip 32 having plural pixels (light receiving elements) 31 which are arranged on a light receiving section for converting the entering light into an electrical signal, a frame-like spacer 33 attached on the bare chip 32 so as to surround the pixels 31, and a cover glass 34 attached on the spacer 33 so as to seal the pixels 31 for protection.

The bare chip 32 is a silicon semiconductor chip, on which an image sensor such as a CCD is formed. Near the edges of four sides of the bare chip 32, plural first contact terminals (bonding pad) 36 for electrically connecting to the circuit board 28 are formed. The bare chip 32 is obtained by forming a plurality of sets of the image sensor and the first contact terminals 36 in a matrix on a wafer (not shown), and dicing the wafer into respective sets. Note that the dicing of the wafer is performed after the plural spacers 33 are formed on a glass substrate (not shown) for the cover glass 34, and the glass substrate is adhered on the wafer. In addition, the spacer 33 is formed of inorganic material such as silicon.

The cover glass 34 can be formed of any transparent glasses, provided that their coefficient of thermal expansion is close to that of the silicon forming the spacer 33. In addition, on the cover glass 34, a step 34*a* is formed around outer periphery of the light entering surface (the surface to face the taking lens 14) for positioning the electromagnetic-wave absorber 29.

As the circuit board 28, a known printed wiring board is used. On a front surface of the circuit board 28, plural second contact terminals (bonding pad) 38 to which the first contact terminals 36 on the mounted image sensor chip 27 are respectively connected by wire boding, and plural grounding (GND) wires 39 connected to the ground are formed. In this embodiment, the GND wires are formed so as to surround the second contact terminals 38. Therefore, an image signal processing chip (not shown) and an image sensor driving chip (not shown), which are mounted on the circuit board 28, can be connected to the second contact terminals 38 by through-wirings (not shown) formed back of the each second contact terminals 38. Note that the chips mounted on the circuit board 28 are not only the image sensor chip 27 and the chip for processing image signal, but also a CPU, a RAM, a ROM, and so on. And on the circuit board 28, plural interconnections and through-wirings are formed for connecting these chips.

Figure 3:
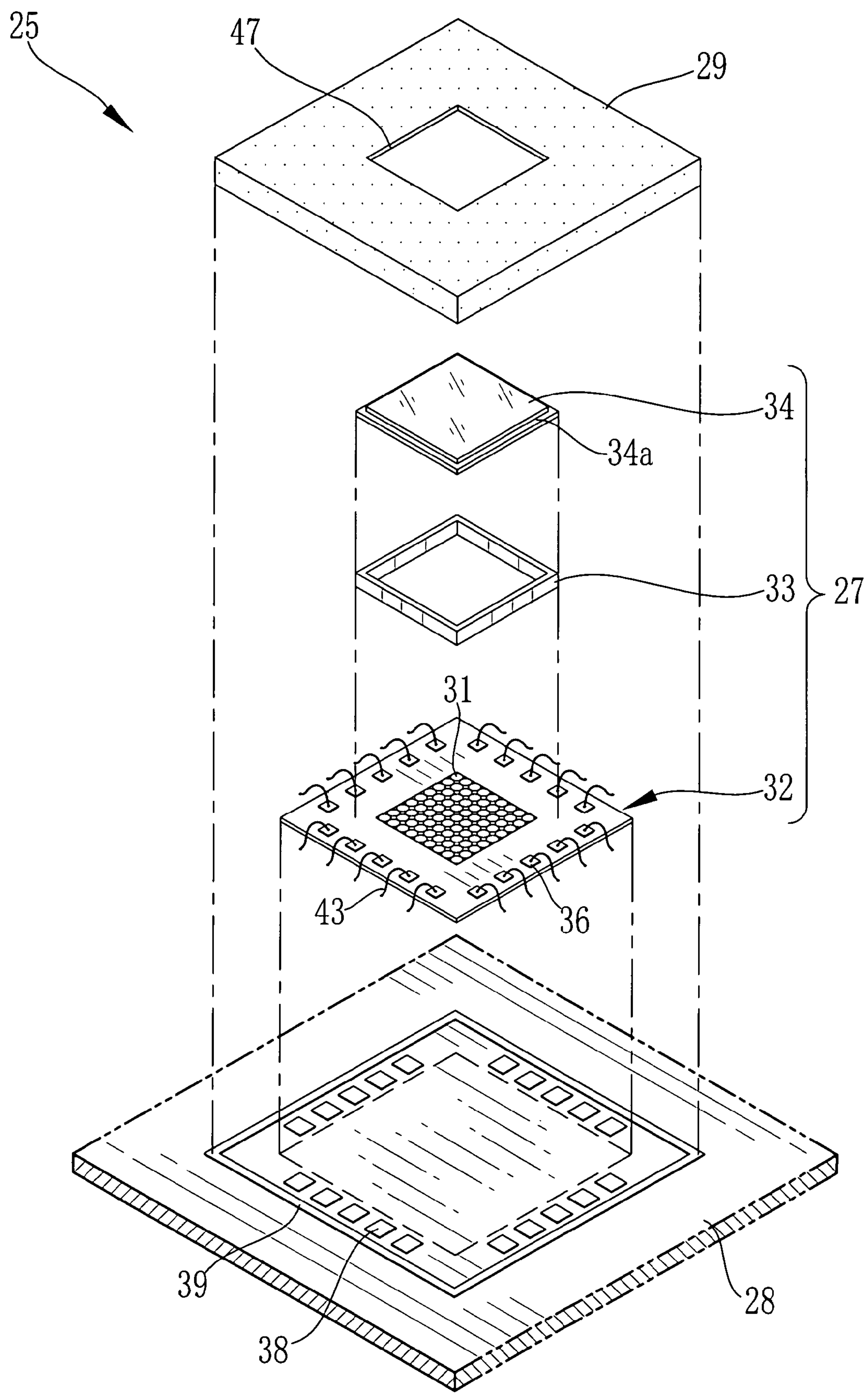
FIG. 3 is an exploded perspective view of the solid state imaging device.
Figure 4:
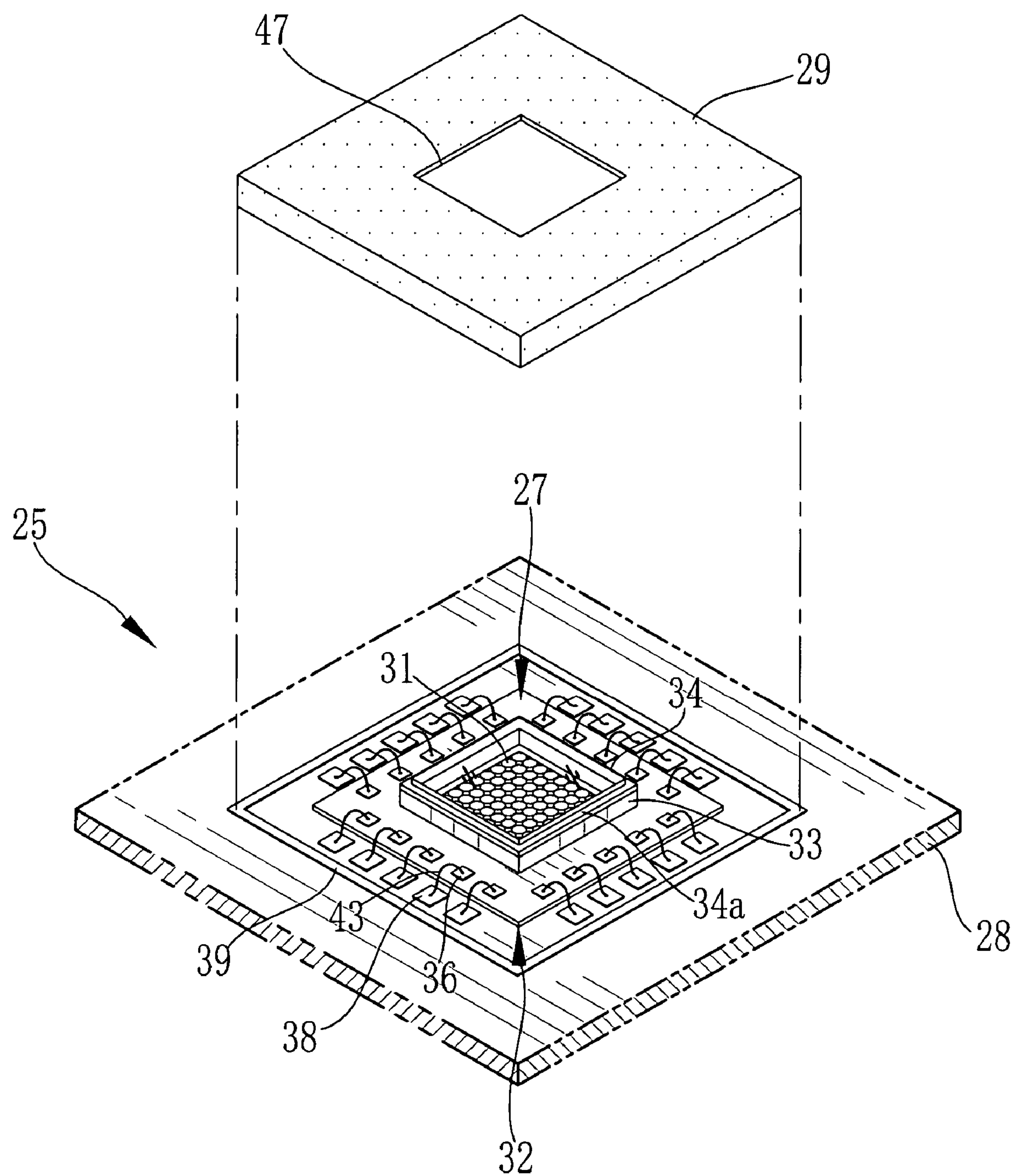
FIG. 4 is an exploded perspective view showing an image sensor chip mounted on a circuit board.

To mounting the image sensor chip 27, first of all, the image sensor chip 27 is fixed on the circuit board 28 at the position shown by a dotted line in FIG. 3. Then the each first contact terminal 36 is connected to the corresponding second contact terminal 38 with bonding wires 43 by using a device for wire bonding (not shown). If necessary, the wire bonding portions are molded with insulating resin (not shown).

Because the image sensor chip 27 is driven at a high clock frequency, the chip for processing image signal and the chip for driving image sensor possibly malfunction due to the electromagnetic noise radiated from the wire bonding portions. However, if the solid state imaging device 25 is contained in the electromagnetic-wave absorbing package of Japanese Patent Laid-Open Publication No. 2003-224218, the size of the solid state imaging device 25 becomes larger.

By considering this problem, in this embodiment, the wire bonding portions (including the first and second contact terminals 36, 38) are covered by the electromagnetic-wave absorber 29 in a manner not to obscure the light entering a light receiving surface of the image sensor chip 27. This method can achieve the same effect as the method of Japanese Patent Laid-Open Publication No. 2003-224218, without enlarging the size of the solid state imaging device 25.

The electromagnetic-wave absorber 29 is formed of for example copper which is an electrically conductive metal. A circuit board-side end 29*a* of the electromagnetic-wave absorber 29 has nearly L-shape in cross section to contact the GND wires 39 with covering the wire bonding portions (refer to FIG. 5). In particular, the electromagnetic-wave absorber 29 is formed such that the end 29*a*, which is bent to nearly L-shape, are positioned on the GND wires 39 when the electromagnetic-wave absorber 29 covers the wire bonding portions.

Further, in the electromagnetic-wave absorber 29, an opening 47 for exposing the cover glass 34 is formed at a position where it faces the light receiving surface of the image sensor chip 27. As described above, the step 34*a* is formed in the cover glass 34. Accordingly, it is preferable that the opening 47 is formed to fit on a convex portion of the cover glass 34 having the step 34*a*. According to this structure, positioning the electromagnetic-wave absorber 29 becomes easy. An opening-side end of the electromagnetic-wave absorber 29 is adhered to the step 34*a* of the cover glass 34 with an adhesive (not shown), while the circuit board-side end 29*a* of the electromagnetic-wave absorber 29 is adhered to the GND wires 39 with a conductive adhesive, such as a silver paste (not shown).

Figure 5A:
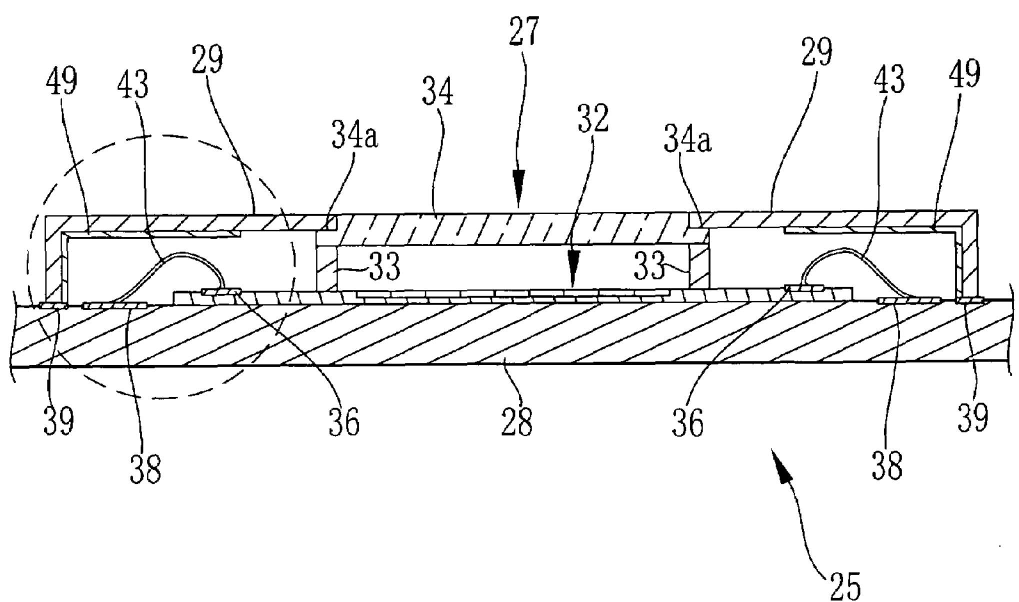
FIG. 5A shows the overall solid state imaging device, and FIG. 5B magnifies a portion enclosed in dotted lines in FIG. 5A.
Figure 5B:
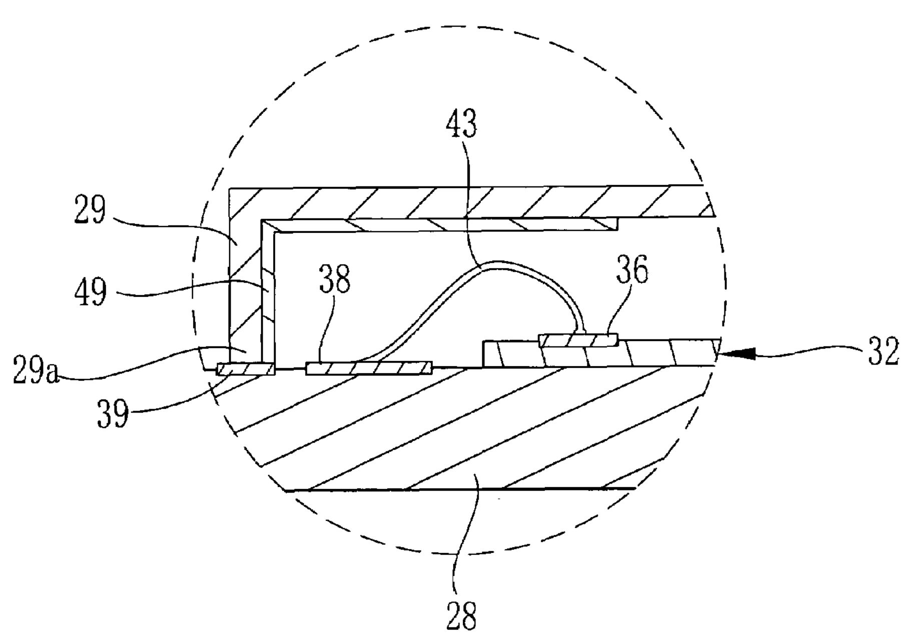

In addition, an insulating film (sheet) 49 formed of any insulating material is fixed on the electromagnetic-wave absorber 29 at a position to face the bonding wires 43 (refer to FIG. 5). Therefore, it prevents the short-circuit problem caused by contacting the bonding wires 43 to the electromagnetic-wave absorber 29 formed of electrically conductive material (copper).

Thus in the solid state imaging device 25 of the present invention, the electromagnetic-wave absorber 29, which is conductive and connected to the ground, covers the wire bonding portion where the first contact terminals 36 of the image sensor chip 27 and the second contact terminals 38 of the circuit board 28 are electrically connected, and therefore much of the electromagnetic noises radiated from the each bonding wire 43 can be absorbed by the electromagnetic-wave absorber 29 at the time of image capturing and so on. In addition, because the opening 47 is formed in the electromagnetic-wave absorber 29 such that the light can enter the light receiving surface of the image sensor chip 27, the electromagnetic-wave absorber 29 does not obstruct the image taking. Note that although the electromagnetic noises may slightly leak from the opening 47, the other chips hardly malfunction because the opening 47 is formed on the opposite side to the circuit board 28.

Next, the operation of the embodiment is described. When the user switches on the digital camera 10 and selects one of the image capturing mode by operating the mode select button 22, the image sensor chip 27 of the solid state imaging device 25 photoelectrically converts the received light from the subject, through the taking lens 14, the opening 47 and the cover glass 34, into the image signal. And the image signal is outputted into the chip for processing image signal, through the first and second contact terminals 36, 38, and the through-wirings formed back of the each second contact terminals 38. At this time, much of the electromagnetic noises radiated from the each bonding wire 43 between the first and second contact terminals 36, 38 are absorbed by the electromagnetic-wave absorber 29 which is connected to the ground. Therefore, the other chips mounted on the circuit board 28 are prevented from malfunctioning.

In addition, it is also prevented that the image sensor chip 27 malfunctions on picking up the electromagnetic noises radiated from the other chips through the bonding wires 43. Further, in this embodiment, the electromagnetic-wave absorber 29 is used to cover the wire bonding portions, instead of the method of Japanese Patent Laid-Open Publication No. 2003-224218 where the whole of the solid state imaging device 25 is contained in the electromagnetic-wave absorbing package. Therefore, the solid state imaging device 25 can be electromagnetically shielded without growing in size.

Note that in the above embodiment, all of the first contact terminals 36 of the image sensor chip 27 (the bare chip 32) and the second contact terminals 38 of the circuit board 28 are connected by the wire bonding. However, the present invention is not limited to this embodiment. Driving signals such as horizontal transfer pulses outputted from the image sensor driving chip to the image sensor chip 27, and output signals (image signals for one frame) outputted from the image sensor chip 27 to the image sensor processing chip in synchronization with the horizontal transfer pulses, have high frequencies of 14-28 MHz. Therefore, large amount of the electromagnetic noises are radiated from the bonding wire 43 which connects the first and the second contact terminals 36, 38 handling these signals.

Figure 6A:
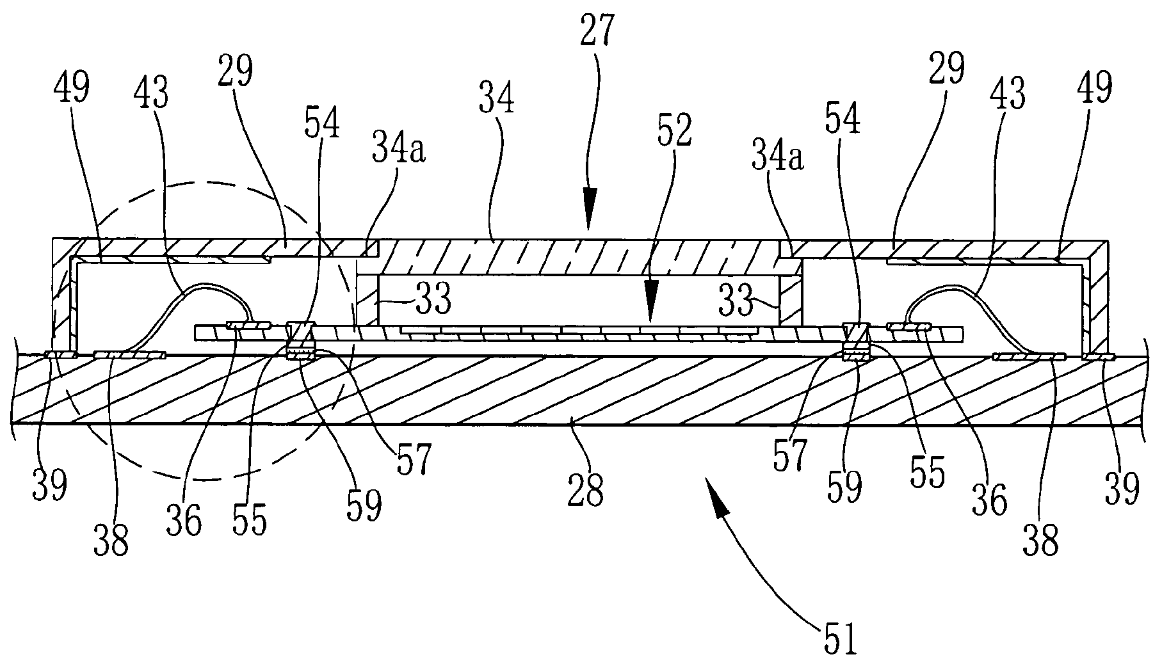
FIG. 6A shows the overall solid state imaging device, and FIG. 6B magnifies a portion enclosed in dotted lines in FIG. 6A.
Figure 6B:
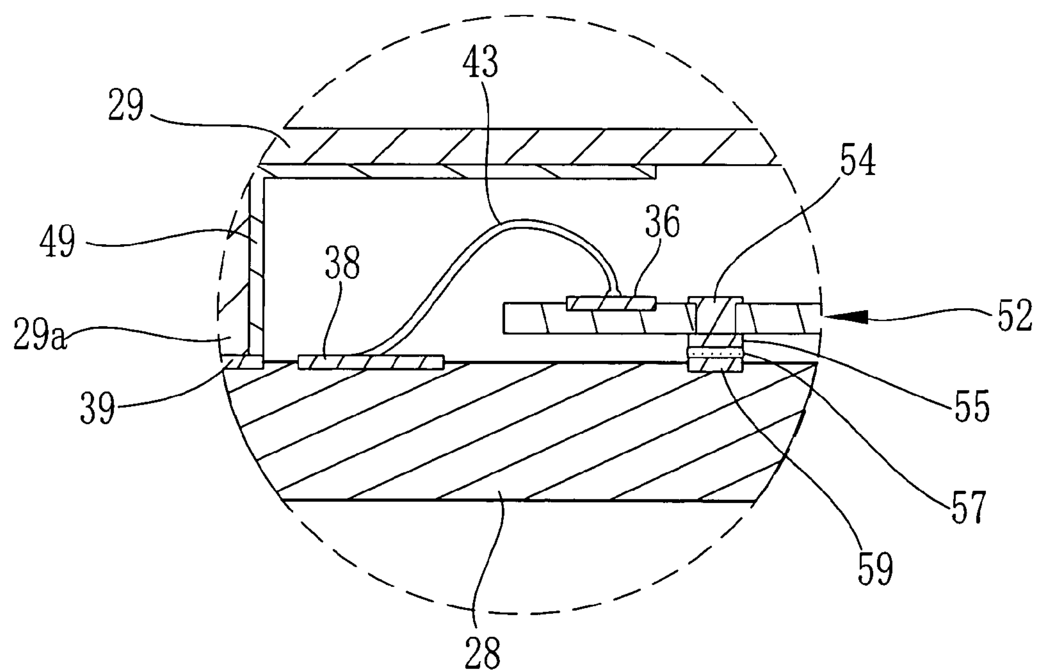

By considering this problem, through-wirings or the like can be provided to penetrate the bare chip such that the horizontal transfer pulses and the output signals are transmitted through the through-wirings. Described below with referring to FIG. 6A and FIG. 6B is a solid state imaging device 51 having a bare chip 52 in which through-wirings are provided. Note that the solid state imaging device 51 has almost the same structure as the solid state imaging device 25 of the above embodiment, therefore the same parts as the above embodiment are carrying the same numerals and their explanations are omitted.

In a bare chip 52 of the solid state imaging device 51, through-wirings for high frequency signals 54 are formed to penetrate the bare chip 52, for inputting the horizontal transfer pulse or outputting the output signals. The through-wirings for high frequency signals 54 are connected to third contact terminals 55 formed on the underside surface of the bare chip 52. On the circuit board 28, fourth contact terminals 59 being connected to the third contact terminals 55 by a soldering layer 57 are formed at positions corresponding to the third contact terminals 55. And other through-wirings (not shown), being connected to the image signal processing chip and the image sensor driving chip, are formed back of the each fourth contact terminals 59, as with the second contact terminals 38 stated above. Note that instead of forming through-wirings for high frequency signals 54, through-holes having metal-coated interior may be formed.

Because the through-wirings for high frequency signals 54 are formed in the bare chip 52 so as to input and output the high frequency signal such as the horizontal transfer pulses and the output signals, amount of the radiated electromagnetic noises is reduced in comparison with the solid state imaging device 25 of the first embodiment. Therefore, the other chips are prevented from malfunctioning more effectively. Note that any kind of signals, not limited to the high frequency signals, may be transmitted through the through-wirings. In this case, the electromagnetic-wave absorber 29 is only required to surround a space between the bare chip 52 and the circuit board 28. Therefore, the quantity of the electromagnetic-wave absorber 29 can be reduced.

Figure 7A:
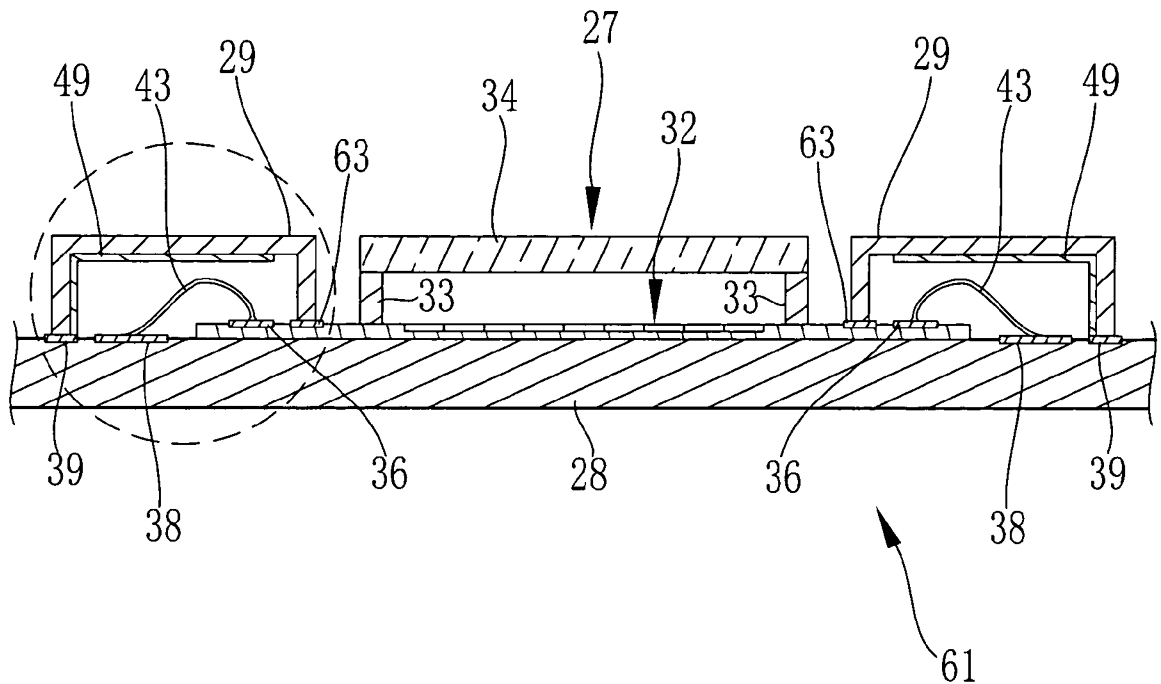
FIG. 7A shows the overall solid state imaging device, and FIG. 7B magnifies a portion enclosed in dotted lines in FIG. 7A.
Figure 7B:
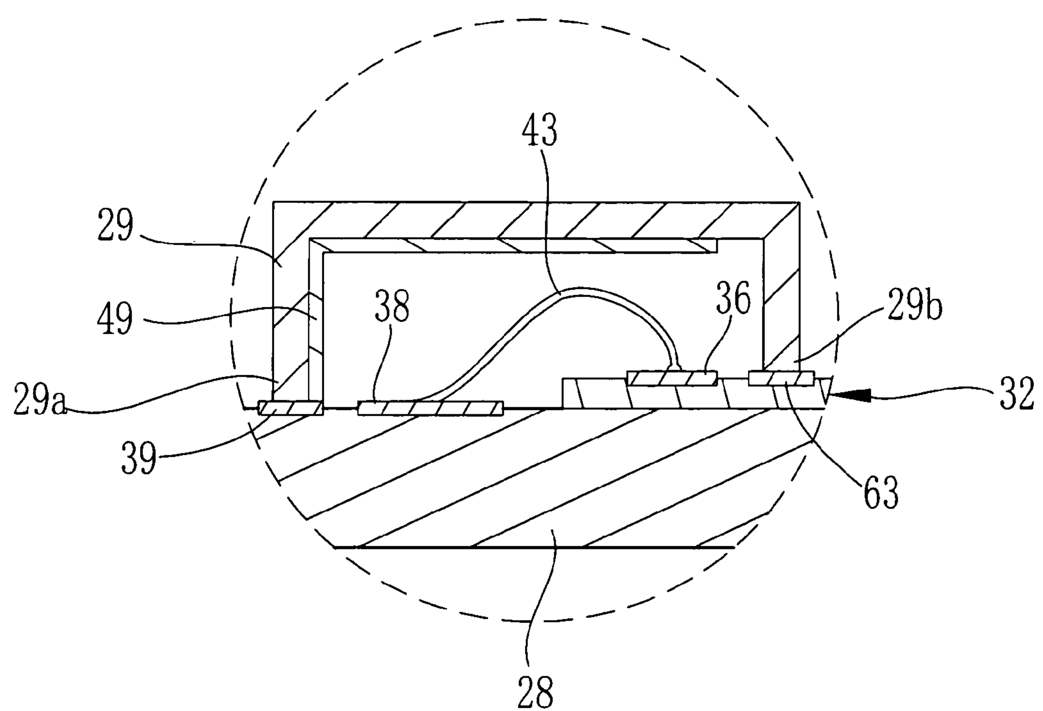

As stated above, in the solid state imaging device 25 of the first embodiment, the electromagnetic noises may slightly leak from the opening 47. By considering this problem, the wire bonding portion can be entirely covered by the electromagnetic-wave absorber 29 in order to completely prevent the leakage of the electromagnetic noises, as a solid state imaging device 61 shown in FIG. 7A and FIG. 7B. Note that the solid state imaging device 61 has the same structure as the solid state imaging device 25 of the first embodiment except the shapes of the electromagnetic-wave absorber 29 and the cover glass 34, therefore the same parts as the above embodiment are carrying the same numerals and their explanations are omitted.

The electromagnetic-wave absorber 29 is formed by bending the end portion, which contacts the step 34*a* in FIG. 5, toward the bare chip 32, to entirely cover the bonding wires 43 (the wire bonding portion). Accordingly, there is no need to form the step 34*a* on the cover glass 34. To entirely cover the bonding wires 43, it is necessary that an end 29*b* of the electromagnetic-wave absorber 29, which is bent toward the bare chip 32, are fixed (adhered) on the bare chip 32. Therefore, it is preferable to form second GND wires 63 having the same shape as the GND wires 39 on the bare chip 32, and to fix the end 29*b* of the electromagnetic-wave absorber 29 on the second GND wires 63 with a conductive adhesive (not shown). According to this structure, the electromagnetic noises radiated from the bonding wires 43 are completely absorbed by the electromagnetic-wave absorber 29.

Note that although the GND wires 39 of the above embodiments are formed to surround the second contact terminals 38, the shape of the GND wires are not limited to the above embodiments. The GND wires 39 may have any shape as long as they will contact at least one portion of the electromagnetic-wave absorber 29. In the above embodiments, the electromagnetic-wave absorber 29 is formed of copper. However, other conductive metals, carbon black, graphites, ferrites, polymers or dielectric materials including powdery conductive materials or short fiber of conductive materials, or so on can be used as the electromagnetic-wave absorber 29.

In the above embodiments, the electromagnetic-wave absorber 29 is formed to cover whole of the image sensor 27, because the first contact terminals 36 are formed along all sides of the rectangular-shaped bare chip 32. However, if the first contact terminals 36 are not formed along all sides, the electromagnetic-wave absorber 29 can be formed to cover only the portion where the wire bonding is applied.

In the above embodiments, the image sensor chip 27 is mounted on a taking lens-side of the circuit board 28. However, the image sensor chip 27 may be mounted on an opposite side to the taking lens-side (underside surface in FIG. 2 to FIG. 5). In this case, a opening for exposing the image sensor chip 27 is formed in the circuit board 28. Then, for example, bumps are formed on the first contact terminals 36, and contact terminals (not shown) are formed on the underside surface of the circuit board 28 at positions corresponding to the first contact terminals 36. And then the electromagnetic-wave absorber covers the portion where the both contact terminals electrically connect to each other.

In the above embodiments, the solid state imaging device of WLCSP type is used. However, the present invention can be also applied to the conventional solid state imaging devices in which the image sensor chip 27 is mounted on a package (semiconductor package substrate) such as a ceramic substrate, a BGA substrate and so on. In this case, the electromagnetic-wave absorber covers the portion where the contact terminals formed on the package connects to the contact terminals formed on the image sensor chip 27.

In the above embodiments, the solid state imaging device is for the digital camera. However, the present invention can also be applied to the solid state imaging devices for any type of an image pickup apparatus or an image reading apparatus such as a digital video camera, a mobile phone with a camera, a scanner or so on.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A solid state imaging device comprising:

a bare chip on which plural pixels are arranged and at least one first contact terminal is formed to electrically connect to said pixels;

a mounting board having at least one second contact terminal to electrically connect to said first contact terminal, said bare chip being mounted on an upper surface of said mounting board;

a bonding wire connected to said first contact terminal and said second contact terminal;

an electromagnetic-wave absorber covering said first contact terminal, said second contact terminal and said bonding wire, without obscuring light entering said pixels, said electromagnetic-wave absorber being attached to said unper surface of said mounting board; and a transparent protection member which faces said pixels to protect said pixels, and an opening for exposing said protection member formed in said electromagnetic-wave absorber.

2. A solid state imaging device as described in claim 1, wherein said electromagnetic-wave absorber comprises metal and connects to a first ground formed on at least one of said bare chip and said mounting board.

3. A solid state imaging device as described in claim 1, wherein said protection member has a step at a position to contact to said electromagnetic-wave absorber, and said step fits in said opening.

4. A solid state imaging device as described in claim 1, further comprising a frame-like spacer disposed on said bare chip to surround said pixels, and said protection member being disposed on said spacer.

5. A solid state imaging device as described in claim 1, further comprising an insulating film being fixed on said electromagnetic-wave absorber at a position to face said bonding wires.

6. A solid state imaging device as described in claim 1, wherein said first ground is provided on said mounting board, an outer peripheral end of said electromagnetic-wave absorber connecting to said first ground, and an inner peripheral end of said electromagnetic-wave absorber forming said opening.

7. A solid state imaging device as described in claim 1, further comprising:

a through-wiring penetrating said bare chip;

a third contact terminal formed on an underside surface of said bare chip to electrically connect to said through-wiring; and a fourth contact terminal formed on said mounting board to electrically connect to said third contact terminal.

8. A solid state imaging device as described in claim 2, further comprising a second ground on said bare chip, wherein said first ground is provided on said mounting board, and said electromagnetic-wave absorber having an outer peripheral end connecting to said first ground and an inner peripheral end connecting to said second ground.

9. A solid state imaging device, comprising:

a bare chip including a plurality of pixels being arranged thereon and at least one first contact terminal being formed to electrically connect to said pixels;

a mounting board having at least one second contact terminal to electrically connect to said first contact terminal, said bare chip being mounted on an upper surface of said mounting board;

a bonding wire connected to said first contact terminal and said second contact terminal;

means for absorbing an electromagnetic-wave emitted from a circuit of the solid state imaging device, said means being attached to said upper surface of said mounting board; and a transparent protection member which faces said pixels to protect said pixels, and an opening for exposing said protection member formed in said electromagnetic-wave absorbing means.

10. A solid state imaging device as described in claim 9, wherein the absorbing means covers said first contact terminal, said second contact terminal and said bonding wire, without obscuring light entering said pixels.

11. A solid state imaging device as described in claim 10, wherein the absorbing means comprises a conductive metal electrically connected to a ground.

12. A solid state imaging device as described in claim 10, further comprising:

wherein said transparent protection member protects said bare chip, said transparent protection member being disposed in the opening formed in said absorbing means.

13. A solid state imaging device as described in claim 12, wherein said absorbing means is electrically conductive and said transparent protection member is insulative.

14. A solid state imaging device as described in claim 10, wherein the absorbing means is smaller than the mounting board.

15. A solid state imaging device as described in claim 12, further comprising:

means for preventing a short-circuit between the bonding wire and the absorbing means.

16. A solid state imaging device as described in claim 9, wherein the absorbing means covers a portion of the bonding wire at a position where the at least one first contact terminal and the at least one second contact terminal are respectively connected.

17. A solid state imaging device as described in claim 9, wherein the absorbing means further comprises means for absorbing electromagnetic noise generated at a time an image signal is outputted into the bare chip for processing through the at least one first contact terminal and the at least one second contact terminal.

18. A solid state imaging device as described in claim 12, wherein the absorbing means comprises an electrically conductive material covering said first contact and said second contact and said bonding wire.

19. A solid state imaging device as described in claim 1, wherein the electromagnetic-wave absorber comprises an electrically conductive material covering said first contact and said second contact and said bonding wire.

* * * * *